United States Patent [19]
Hirakawa

[11] Patent Number: 5,943,260
[45] Date of Patent: Aug. 24, 1999

[54] METHOD FOR HIGH-SPEED PROGRAMMING OF A NONVOLATILE SEMICONDUCTOR MEMORY DEVICE

[75] Inventor: Tsuyoshi Hirakawa, Tokyo, Japan

[73] Assignee: NEC Corporation, Tokyo, Japan

[21] Appl. No.: 09/027,215

[22] Filed: Feb. 20, 1998

[30] Foreign Application Priority Data

Feb. 21, 1997 [JP] Japan ................................. 9-054048

[51] Int. Cl.$^6$ ........................................... G11C 7/00
[52] U.S. Cl. .................... 365/185.03; 365/185.11; 365/185.19; 365/230.03
[58] Field of Search ................... 365/185.03, 185.11, 365/230.03, 185.19

[56] References Cited

U.S. PATENT DOCUMENTS

| | | | |
|---|---|---|---|
| 5,764,571 | 6/1998 | Banks | 365/185.03 X |
| 5,815,436 | 9/1998 | Tanaka et al. | 365/185.03 |
| 5,815,439 | 9/1998 | Korsh et al. | 365/185.03 X |

FOREIGN PATENT DOCUMENTS

| | | |
|---|---|---|
| 6-267285 | 9/1994 | Japan . |
| 2502008 | 3/1996 | Japan . |

*Primary Examiner*—Do Hyun Yoo
*Attorney, Agent, or Firm*—Foley & Lardner

[57] ABSTRACT

A flash EEPROM has a plurality of multi-valued memory cells grouped in a plurality blocks or pages for parallel programming. If the data values for parallel programming include data "10" for a first group, data "01" for a second group and data "00" for a third group of memory cells in a page, a first voltage corresponding to data "10" is applied to the first through third groups, a second voltage corresponding to data "01" is applied to the second and the third groups, and a third voltage corresponding to data "00" is applied to the third groups, thereby reducing the programming time length for the parallel programming.

5 Claims, 16 Drawing Sheets

| VALUES FOR PARALLEL PROGRAMMONG | PRESENT EMBODIMENT | FIRST CONVENTIONAL TECHNIQUE | SECOND CONVENTIONAL TECHNIQUE |
|---|---|---|---|
| "10" & "01" & "00" | 139 μS | 153 μS | 300 μS |
| "10" & "00" | 101 μS | 152 μS | 300 μS |
| "01" & "00" | 92 μS | 152 μS | 300 μS |
| "10" & "01" | 98 μS | 152 μS | 60 μS |
| "00" | 51 μS | 151 μS | 300 μS |
| "01" | 51 μS | 151 μS | 60 μS |
| "10" | 51 μS | 151 μS | 6 μS |

METHOD FOR HIGH-SPEED PROGRAMMING OF A NONVOLATILE SEMICONDUCTOR MEMORY DEVICE

BACKGROUND OF THE INVENTION (a) Field of the Invention

The present invention relates to a method for high-speed programming of a nonvolatile semiconductor memory device and, more particularly, to a technique for programming of an EEPROM or flash EEPROM having a multi-valued memory cell.

(b) Description of the Related Art

EEPROM (Electrically Erasable and Programmable Read Only Memory) and flash EEPROM are known in the art as non volatile memory devices wherein the memory cells are electrically programmed and erased.

FIG. 1 shows the structure of a typical memory cell of a known flash EEPROM, wherein n-conductivity type source 102 and drain 101 are formed on the surface of a p-conductivity type silicon substrate 100, with a channel region 103 disposed therebetween. A tunnel oxide film 104, a floating gate 105, an interlevel dielectric film 106 and a control gate 107 are consecutively formed above the channel region 103. The source 102 and the drain 101 are connected to a source line 109 and a bit line 108, respectively.

Programming of the memory cell in the flash EEPROM is effected, for example, by applying about 12 volts to the control gate 107, about 5 volts to the drain 101 and zero volts to the source 102, with the substrate 100 maintained at a ground potential, so as to raise the potential of the floating gate 105 by using capacitive coupling between the control gate 107 and the floating gate 105. The potential rise of the floating gate 107 forms a channel between the source 102 and the drain 101, and the voltage between the control gate 107 and the drain 101 generates hot electrons in the vicinity of the drain 101, which are injected into the floating gate 105 against the potential barrier (3.2 electron volts for electrons, for example) between the silicon substrate 100 and the tunnel oxide film 104.

The injected electrons stay in the floating gate 105 after programming, to thereby raise the threshold of the MOSFET or memory cell, because the floating gate 105 is surrounded by the insulator film.

The erasing operation is effected by applying about 12 volts to the source 102, with the control gate 107 grounded, so as to pull out the electrons from the floating gate 105, thereby lowering the threshold voltage of the MOSFET. In this example, the memory cell has a binary threshold voltage.

It is proposed recently that the EEPROM have more than binary data or multi-valued data in each memory cell, namely, a single memory cell have multi-valued states for the threshold.

Referring to FIG. 2 showing a schematic configuration of a nonvolatile semiconductor memory device having multi-valued data, a row decoder 203, which receives an output from a variable voltage generator 204, supplies an active signal to one of a plurality of word lines each connected to the control gates of a row of memory cells in a memory cell array. A row of the memory cell array includes a plurality of groups or pages of memory cells each disposed in a plurality of (8 in this example) columns 223 to 230 to be programmed at a time in a parallel programming operation.

The drains of the memory cell in each column is connected to a bit line connected to a corresponding one of write blocks 207 to 214 through a corresponding one of column decoders 215 to 222. The write blocks 207 to 214 are supplied with programming pulses from a column pulse generator 201 for parallel programming. The input address data in the input data 206 are supplied to the row decoder 203 and the column decoders 215 to 222, which select one of word lines and one of bit lines, respectively, to select a corresponding memory cell.

A program data sense block 205 receives input data 206 to sense the number of data values in a parallel programming step for a page of memory cells. The program data sense block 205 controls the variable voltage generator 204 and the column pulse generator 201 to provide a programming voltage to a selected word line and provide constant voltage pulses ranging from zero to several pulses in number to selected bit lines for the page, respectively.

A technique for programming of multi-valued data to a memory cell is described in, for example, Patent Publication JP-A-6-267285, which may be applied to a parallel programming mode. Referring to FIG. 3, the technique includes application of a sequence of programming voltages, or a stepwise-rising voltage pulse rising from zero volt to 12 volts through 10 volts and 11 volts and staying at the respective voltage levels for 1 millisecond (ms) each, to the control gates of a selected row of the memory cells through a selected word line and application of a 8.5-volt pulse to a bit line for 0.8 ms from the column pulse generator at the timing of the desired voltage level of the stepwise rising voltage, thereby injecting hot electrons in a corresponding amount to the floating gate of the specified memory cell for programming. After the programming, the specified memory cell has a threshold voltage based on one of the voltage levels of the stepwise-rising voltage, which correspond to "00", "01", "10" and "11" of the data for the multi-valued memory cell, wherein either data "00" or "11" corresponds to a state of the memory cell which is not programmed or erased.

Referring to FIG. 4 showing variation of the threshold voltage after the programming operation by the programming voltage shown in FIG. 3, the number of memory cells (or number of bits) is plotted on abscissa against threshold voltage of the memory cells plotted on ordinate. Assuming that data "11" corresponds to an erased state, for example, the arrow designated by 301 illustrates the threshold rise of the memory cell programmed by 10 volts, or first programming voltage. Similarly, arrows 302 and 303 correspond to the threshold rise of the memory cells programmed by 11 volts (second programming voltage) and 12 volts (third programming voltage), respectively, to obtain data "01" and "00".

A verifying operation is generally conducted to the multi-valued memory cell after the programming thereof, wherein it is examined whether the memory cell has a desired threshold voltage corresponding to the programming voltage applied. The verifying operation is effected by comparing the threshold voltage of each memory cell against the reference voltage level ref.1 (7 volts), ref.2 (5.5 volts) or ref.3 (4 volts) by applying a read voltage to the selected bit line and word line to thereby judge the threshold voltage level. If the memory cell does not have a desired threshold range, then the application of the programming voltage and a verifying operation are repeated until the memory cell exhibits a desired threshold range.

More specifically, for example, if the value of a programming data is "10", the threshold voltage of the programmed memory cell is compared against 4 volts. If it is judged that the threshold voltage is higher than 4 volts, the threshold voltage is then compared against 5.5 volts. If it is judged that the threshold voltage is below 5.5 volts, then the threshold voltage is judged to be correct, thereby completing the programming operation of the memory cell. Otherwise, if it is judged that the threshold voltage is below 4 volts, the programming and verifying operation is repeated. Similarly, if the value of the programming data is "01" or "00", the threshold voltage is examined whether it resides between 5.5 volts and 7 volts or above 7 volts.

In the conventional method for programming multi-valued memory cells in the flash EEPROM, the programming time length is generally large, and accordingly, a higher programming voltage may be desired together with a plurality of programming steps irrespective of value for the parallel programming data so as to reduce the time length for the single programming operation, although the higher programming voltage increases the number of programming steps and verifying steps.

Referring to FIG. 5, there are shown relationships between the threshold voltage and the time length for programming by the respective data by applying the corresponding programming voltages, wherein each data can be obtained after 50 microseconds ($\mu$s) of programming. The graph also shows the threshold voltage after the programming by the third programming voltage of 12 volts, which corresponds to data "00". The threshold voltage reaches to the first level corresponding to data "10" after 1 $\mu$s, to the second level corresponding to data "01" after 10 $\mu$s, and to the third level corresponding to data "00" after 50 $\mu$s. In this respect, data "01" and "10" can be obtained in a higher rate by the application of the higher programming voltage.

Referring to FIG. 6 showing variation of the threshold voltage in three samples of memory cells during programming to data "00" and data "10" by applying the respective programming voltages, it can be seen that data "00" corresponding to the higher programming voltage generates a large variation in the threshold voltages during the programming step. This results in a large variation in the threshold voltage for data "10" or "01" after the programming by the higher voltage level.

As a result of the variation after applying the higher programming voltage to the memory cell irrespective of the values for the programming data, the graph of variation in the threshold voltage shown in FIG. 4 changes to the graph shown in FIG. 7. Specifically, the higher programming voltage, which increases the variation in the threshold voltage, generates a significant number of error bits having threshold voltages exceeding the boundary threshold voltages ref.3, ref.2 and ref.1. In order to avoid the occurrence of the error bits, the repeated number of programming and verifying steps in a single programming operation should be increased, which increases the programming time length however.

In FIG. 5, if a plurality of combinations of a programming and verifying step are to be effected in a single programming operation by using the higher programming voltage, wherein it is assumed that a programming step and a verifying step consumes 200 nanoseconds (ns) and 1 $\mu$s, respectively, a complete programming operation for data "00" requesting 50 $\mu$s of application of the higher programming voltage must be effected for as large as 250 times (50 $\mu$s/250 ns=250), which consumes a large programming time. This example will be mentioned later as a second convential technique.

SUMMARY OF THE INVENTION

In view of the above, it is an object of the present invention to provide a method of programming of multi-valued memory cells in a nonvolatile memory device at a higher speed with a high reliability, which is especially suited for a parallel programming operation for a flash EEPROM.

The present invention provides a method for programming a nonvolatile memory device having a plurality of memory cells, grouped in a plurality of blocks, for storing multi-valued data based on multi-valued threshold voltage, the method comprising the step of detecting a plurality of program data to be programmed in the memory cells in one of the blocks, and further, upon detecting a first value to be programmed in a first group of the memory cells in the one of blocks and a second value to be programmed in a second group of the memory cells in the one of blocks, the steps of consecutively applying a first programming voltage, which corresponds to the first value, to the first group and the second group maintained at a first potential, and applying a second programming voltage, which corresponds to the second value, to the second group, the second programming voltage with respect to the first potential being larger than the first programming voltage with respect to the first potential.

In accordance with the method of the present invention, the programming time length for a parallel programming operation to a block can be reduced for a case wherein data for parallel programming has a plurality of different values for different groups of the block, because the second group of the memory cells are pre-programmed to a state corresponding to the first programming voltage from the first potential.

The above and other objects, features and advantages of the present invention will be more apparent from the following description, referring to the accompanying drawings.

BRIEF DESCRIPTION OF THE DRAWINGS

FIG. 16 is a table for showing advantages of the embodiment of the present invention over conventional techniques.

PREFERRED EMBODIMENTS OF THE INVENTION

Figure 1:
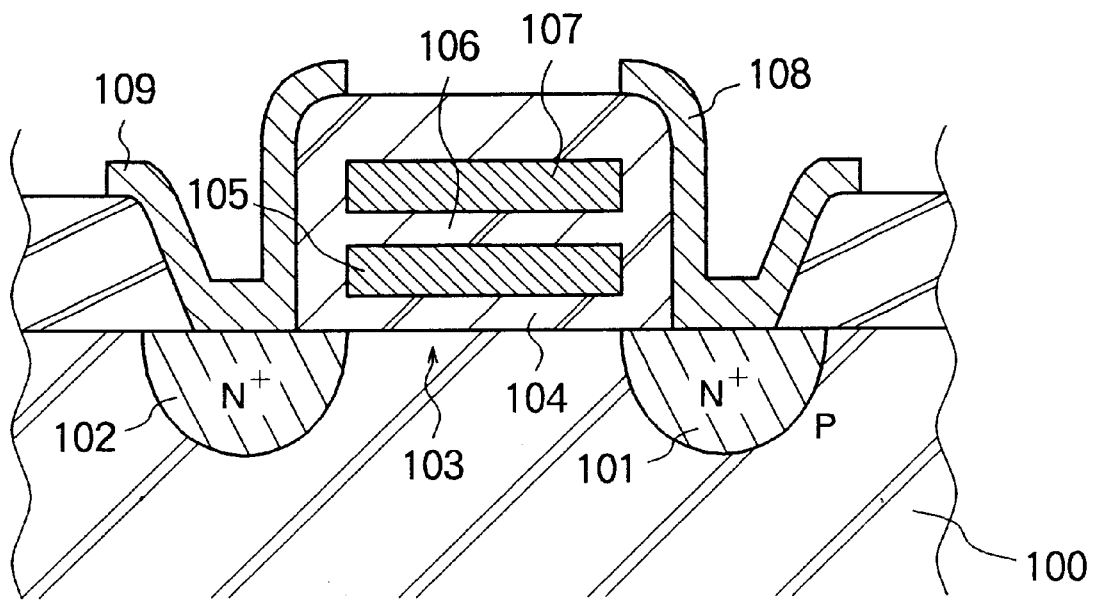
FIG. 1 is a cross-sectional view of a typical memory cell of an EEPROM.

Now, the present invention is more specifically described with reference to accompanying drawings, wherein similar constituent elements are designated by the same or similar reference numerals.

Figure 4:
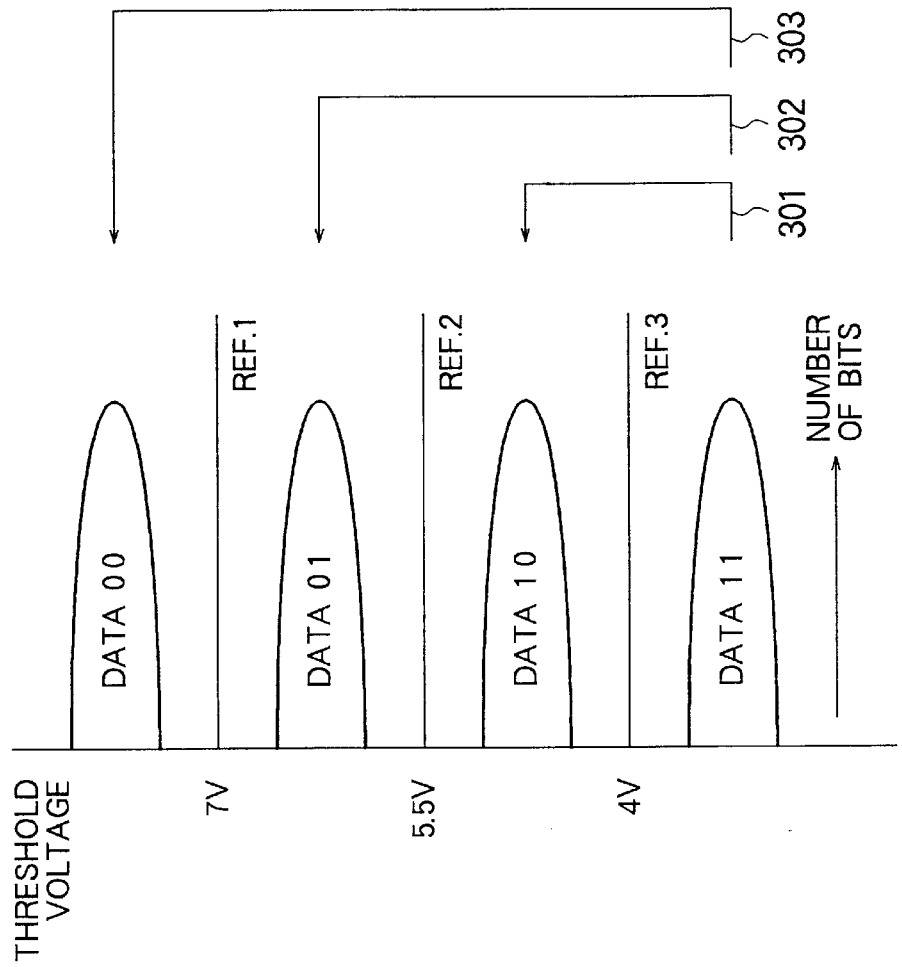
FIG. 4 is a graph for showing variation in the threshold voltage after programming multi-valued memory cells.
Figure 5:
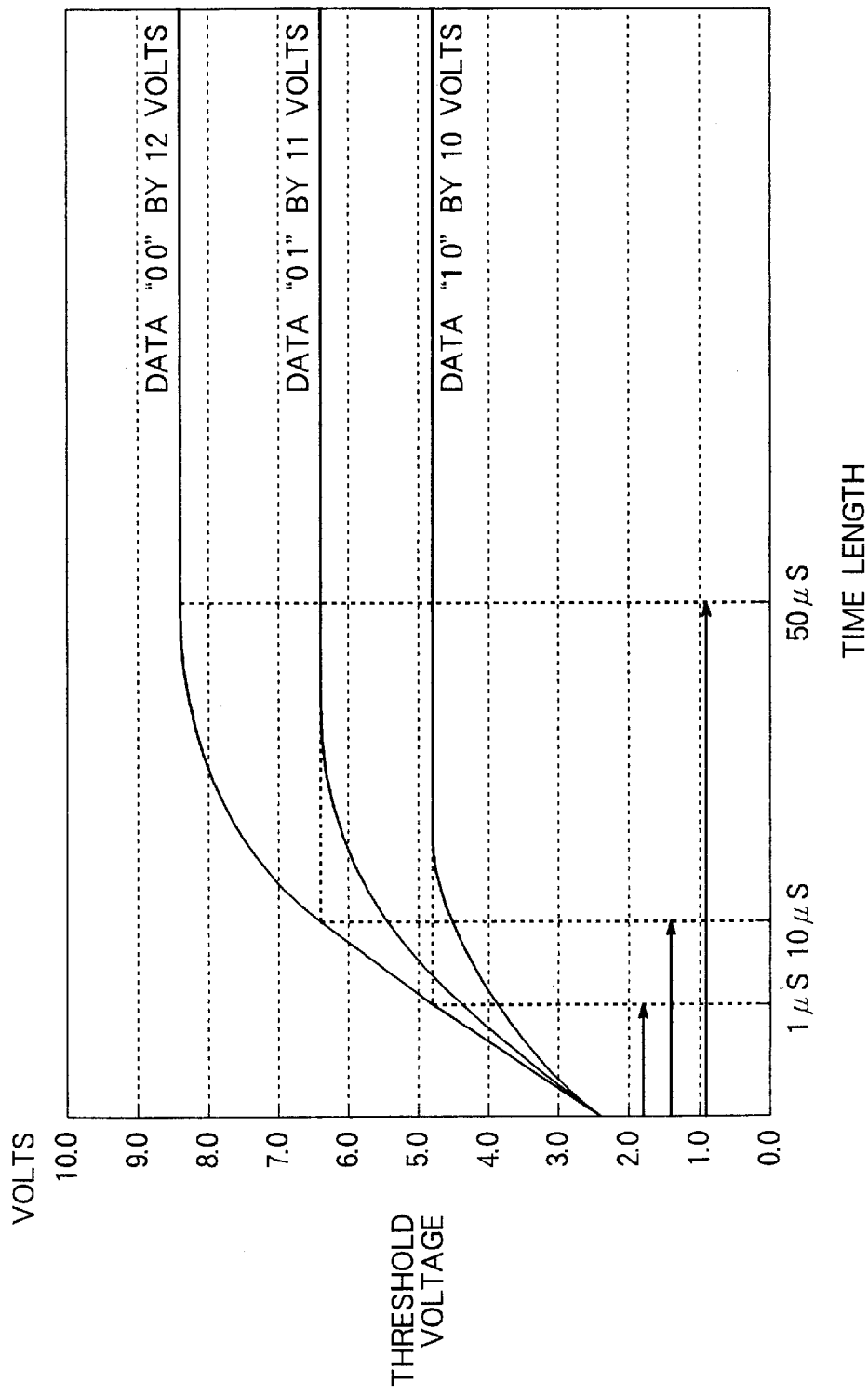
FIG. 5 is a graph for showing threshold voltage after programming plotted against the programming time length by respective programming voltages.
Figure 6:
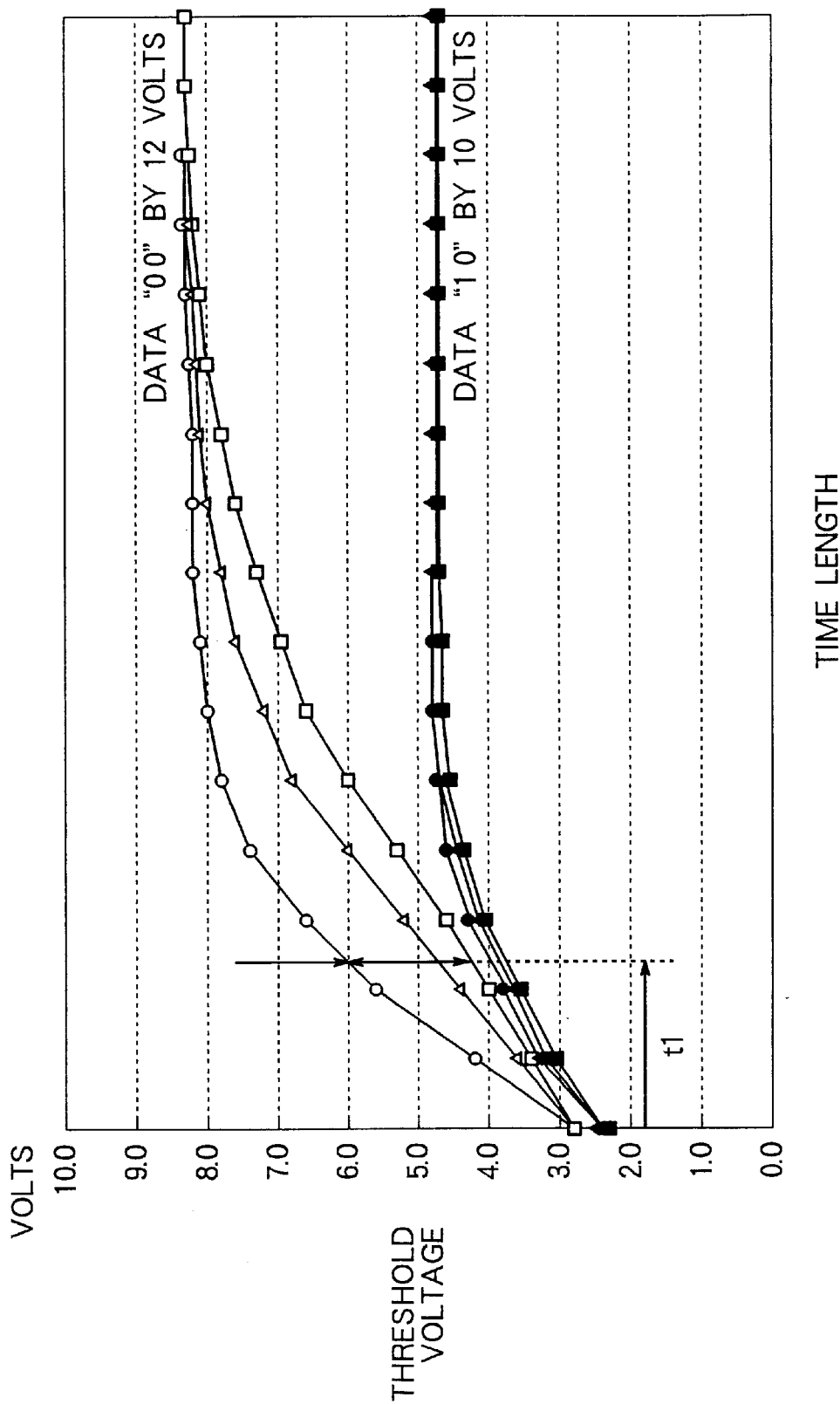
FIG. 6 is a graph for showing variation of the threshold voltage of samples plotted against programming time length on abscissa.
Figure 7:
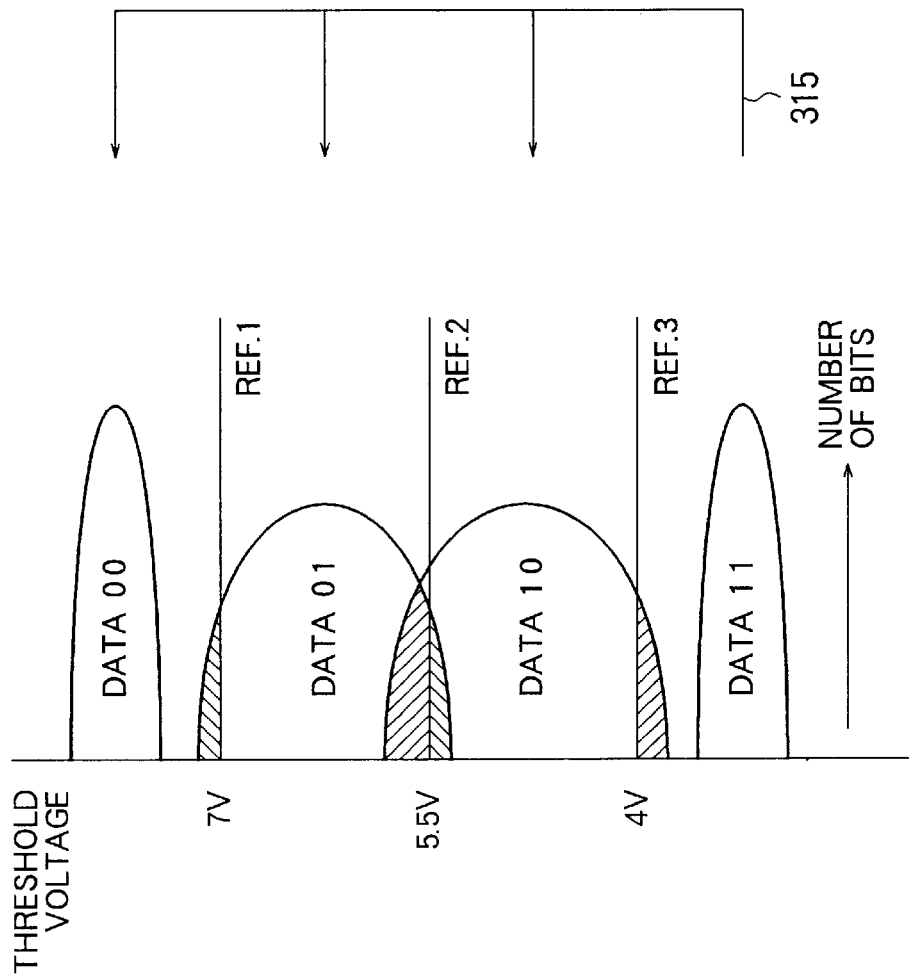
FIG. 7 is a graph similar to the graph of FIG. 4 in the case of a higher programming voltage.
Figure 8:
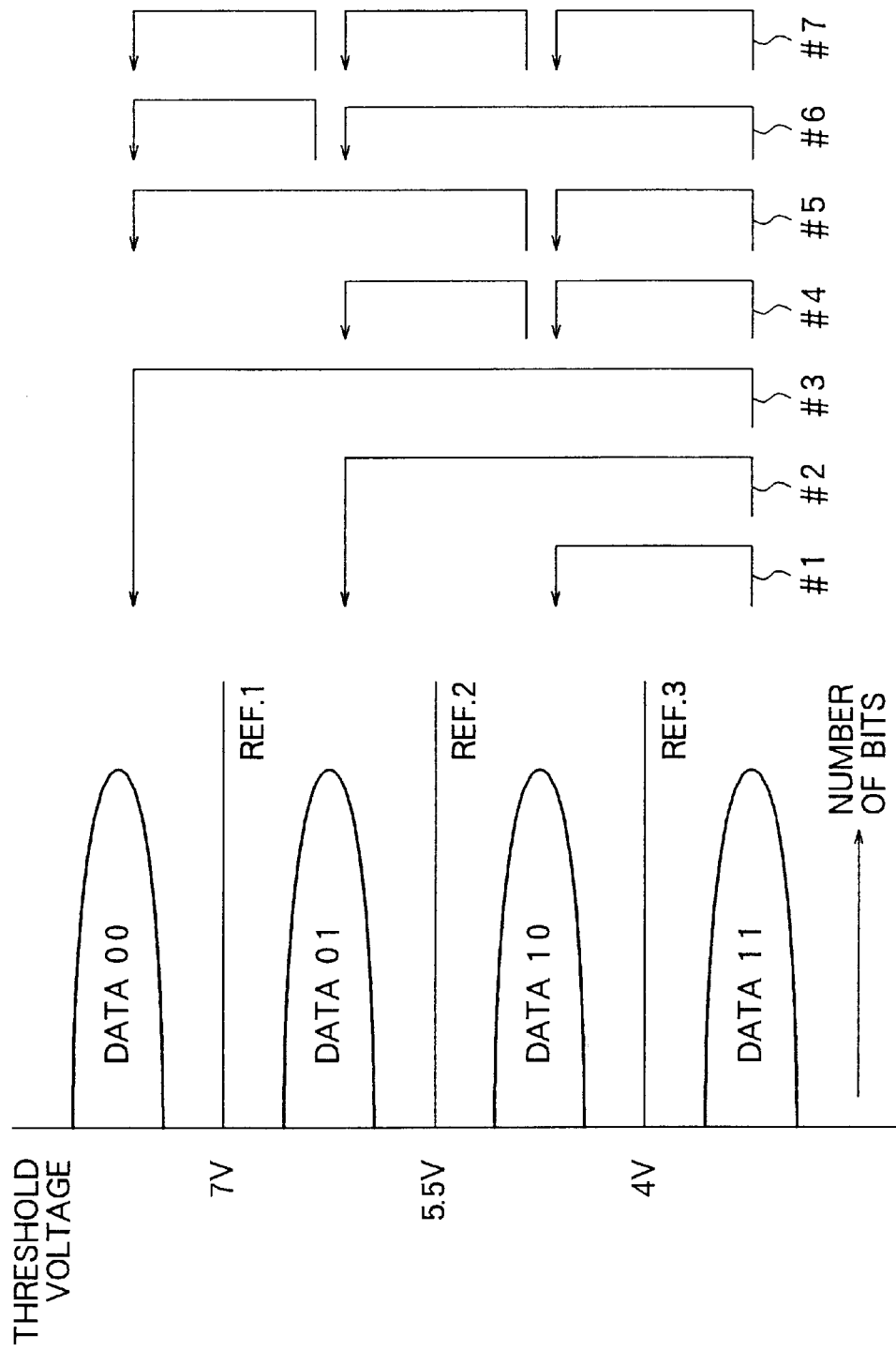
FIG. 8 is a graph for showing variation in the threshold voltage after programming multi-valued memory cells according to an embodiment of the present invention.

Referring to FIG. 8, there is shown a principle of a method for parallel programming of a multi-valued memory cell according to an embodiment of the present invention, wherein number of bits are plotted on abscissa against the programmed threshold voltage plotted on the ordinate. Data "11", "10", "01" and "00" correspond to an erased state, a first (lower) programmed threshold voltage, a second (intermediate) programmed threshold voltage and a third (higher) programmed threshold voltage of the multi-valued memory cell, which correspond to zero volt, a first programming voltage (10 volts), a second programming voltage (11 volts) and a third programming voltage (12 volts), respectively. Reference voltages ref.1 (7 volts), ref.2 (5.5 volts) and ref.3 (4 volts) are similar to those described in connection with FIG. 4. Specifically, a memory cell is verified by comparing the threshold voltage of the same against these reference voltages for examining whether the memory cell has a desired programmed threshold voltage.

Arrows #1, #2 and #3 at the right hand in FIG. 8 indicate that the parallel programming of a page (or block) of erased memory cells to a single common value is effected by a single programming step using the programming voltage level corresponding to the programmed value. Arrows #4 indicate that, if the parallel programming of a page of erased memory cells includes programming for a first group of the page to data "10" and for a second group of the page to data "01", the second group specified to data "01" is programmed by two steps: one for programming to data "10" together with the first group specified to data "10", and the other for programming from data "10" to data "01". After each of these steps, a verifying step is conducted. Arrows #5 and #6 indicate different two-step programming operations and arrows #7 indicate a three-step programming operation.

Figure 2:
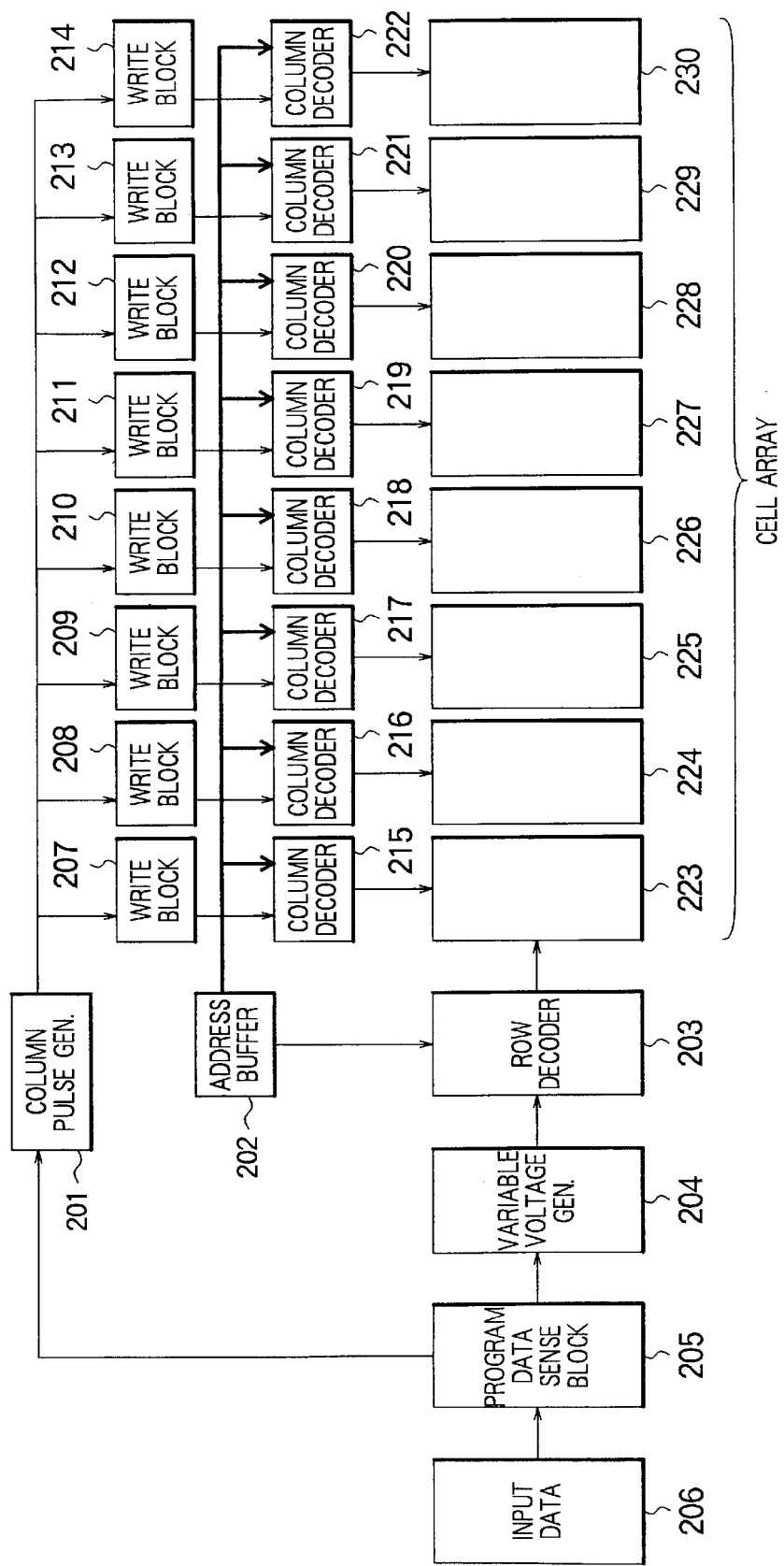
FIG. 2 is a block diagram of a conventional flash EEPROM implementing a parallel programming operation.
Figure 9:
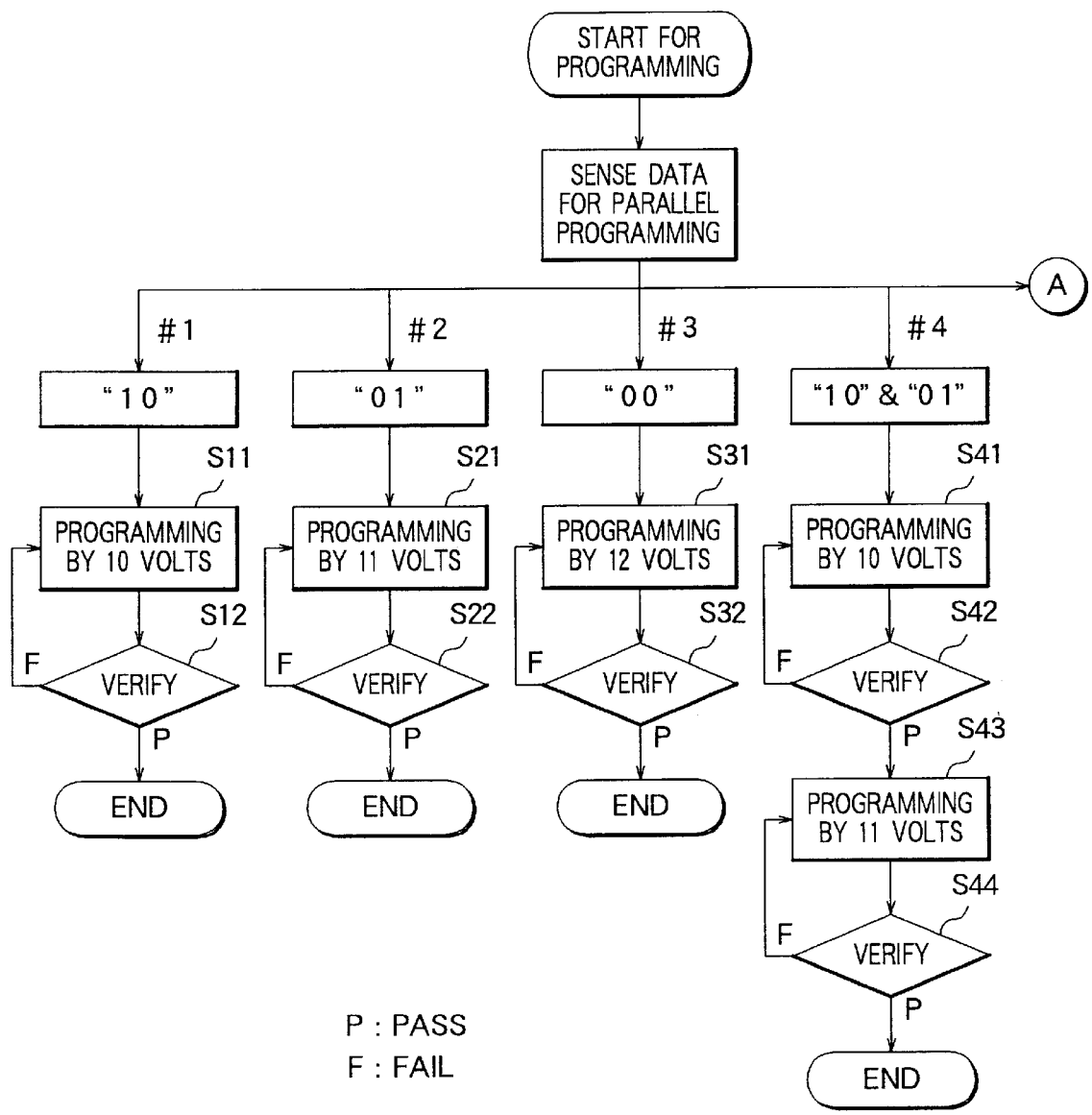
FIG. 9 is a part of a flowchart of a programming process according to the embodiment of FIG. 8.
Figure 10:
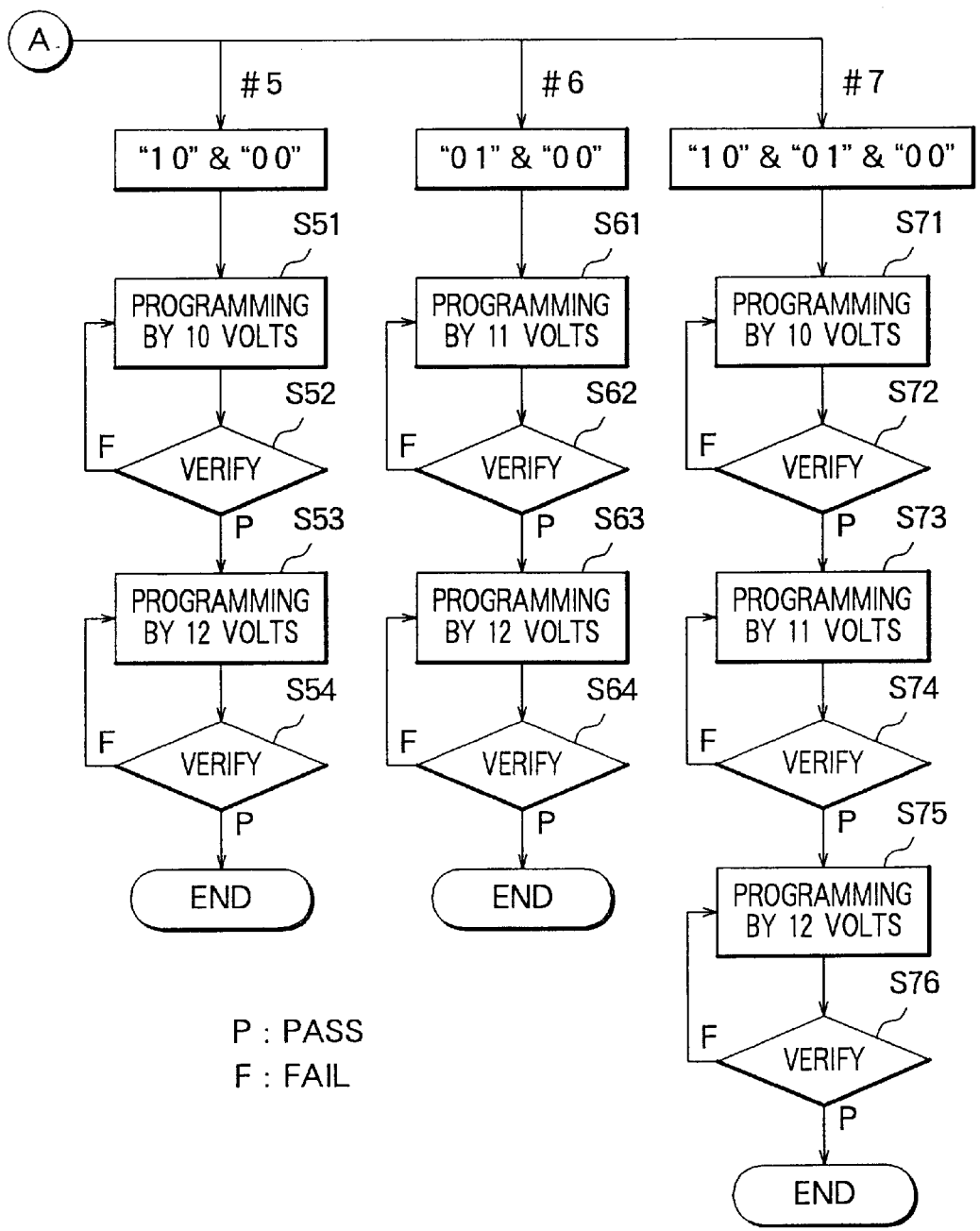
FIG. 10 is a remaining part of the flowchart of FIG. 9.
Figure 11A:
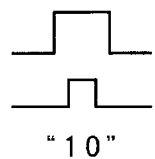
FIGS. 11A to 11G are waveforms of programming voltages used in the embodiment of FIGS. 9 and 10.
Figure 11B:
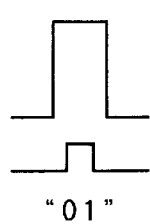
Figure 11C:
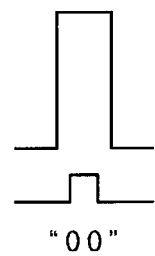

More specifically, referring to FIGS. 9 and 10 showing in combination a flowchart of the programming process according the embodiment of FIG. 8, after the programming operation is started, the parallel programming data to be used for programming a specified page of memory cells is detected by a program data sense block such as shown in FIG. 2. In FIGS. 9 and 10, the flows #1 to #7 correspond to arrows #1 to #7, respectively, shown in FIG. 8. If the values for parallel programming are all "10" for the page, the process advances to flow #1, wherein a first programming voltage (10 volts) is applied to the selected word line and a select pulse is applied to drains of memory cells in the page through the corresponding bit lines in step S11, thereby programming the page of memory cells as a whole to data "10". The first programming voltage and the select voltage used herein are shown in FIG. 11A. Subsequently, the threshold voltage is read from the page of the memory cells for verifying the programmed data in step S12. If the threshold voltages of all the programmed memory cells reside within the desired voltage range, then the process comes to an end of the programming. If not, the process returns to the preceding programming step S11 until the programmed threshold voltage turns correct.

Similarly, if all of the values for parallel programming are "01" or "00", then process advances to flow #2 or flow #3, wherein a programming operation is effected in step S21 or S31 by using a second programming voltage (11 volts) and a select pulse as shown in FIG. 3B, or a third programming voltage (12 volts) and a select pulse as shown in FIG. 3C, followed by a verifying operation in step S22 or S32.

Figure 11D:
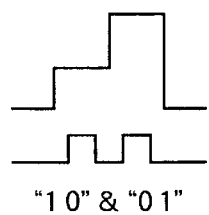

If the values for parallel programming are "10" for a first group of memory cells and "01" for a second group of memory cells in the page, the process advances to flow #4, wherein a first programming voltage is applied to the first and the second groups of the memory cells in step S41 together with a select pulse for programming the memory cells to data "10", followed by a verifying operation in step S42. If the memory cells pass the verifying operation, a second programming voltage is applied to the word line whereas a select pulse is applied to the bit lines of the second group in step S43 for programming the second group from data "10" to data "01", followed by verifying the second group for data "01" in step S44. The programming voltages used herein are shown in FIG. 11D.

Figure 11E:
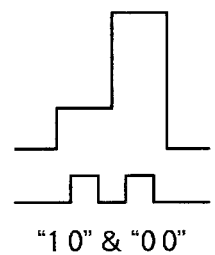

If the values for parallel programming are "10" for a first group and "00" for a second group in the page, the process advances to flow #5, wherein a first programming voltage is applied to the first and the second groups of the memory cells together with a select pulse in step S51 for programming the memory cells to data "10", followed by a verifying operation in step S52. If the memory cells pass the verifying operation, a third programming voltage is applied to the word line whereas a select pulse is applied to the bit lines of the second group in step S53 for programming the second group from data "10" to data "00", followed by verifying the second group of the memory cells for data "00" in step S54. The programming voltages used herein are shown in FIG. 11E.

Figure 11F:
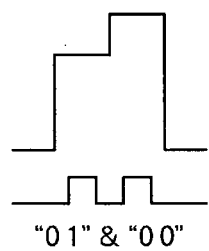

If the values for the data of parallel programming are "01" for a first group and "00" for a second group in the page, the process advances to flow #6, wherein a second programming voltage is applied to the first and the second groups of the memory cells together with a select pulse in step S61 for programming the memory cells to data "01", followed by a verifying operation in step S62. If the memory cells pass the verifying operation, a third programming voltage is then applied to the word line whereas a select pulse is applied to the bit lines of the second group in step S63 for programming the second group from data "01" to data "00", followed by verifying the second group of the memory cells for data "00" in step S64. The programming voltages used herein are shown in FIG. 11F.

If the values for parallel programming are "10" for a first group, "01" for a second group and "00", for a third group in the page, the process advances to flow #7, wherein a first programming voltage is applied to the first through third groups of the memory cells together with a select pulse in step S71 for programming the memory cells to data "10", followed by a verifying operation in step S72. If the memory cells pass the verifying operation, a second programming voltage is then applied to the word line whereas a select pulse is applied to the bit lines of the second and third groups in step S73 for programming the second and third groups from data "10" to data "01", followed by verifying the second group and third for data "01" in step S74.

Figure 11G:
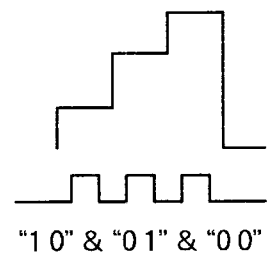

If the memory cells pass the verifying step, then a third programming voltage is applied to the word line whereas a select pulse is applied to the bit lines of the third group in step S75 for programming the third group from data "01" to data "00", followed by a verifying operation in step S76. If the third group pass the verifying step, the programming operation is finished. The programming voltages applied to the word line are formed as a stepwise rising voltage pulse including consecutively a first voltage level, a second voltage level and a third voltage level, with an interval disposed therebetween for a verifying operation, and is accompanied by respective select pulses applied to bit lines, as shown in FIG. 11G.

Figure 12:
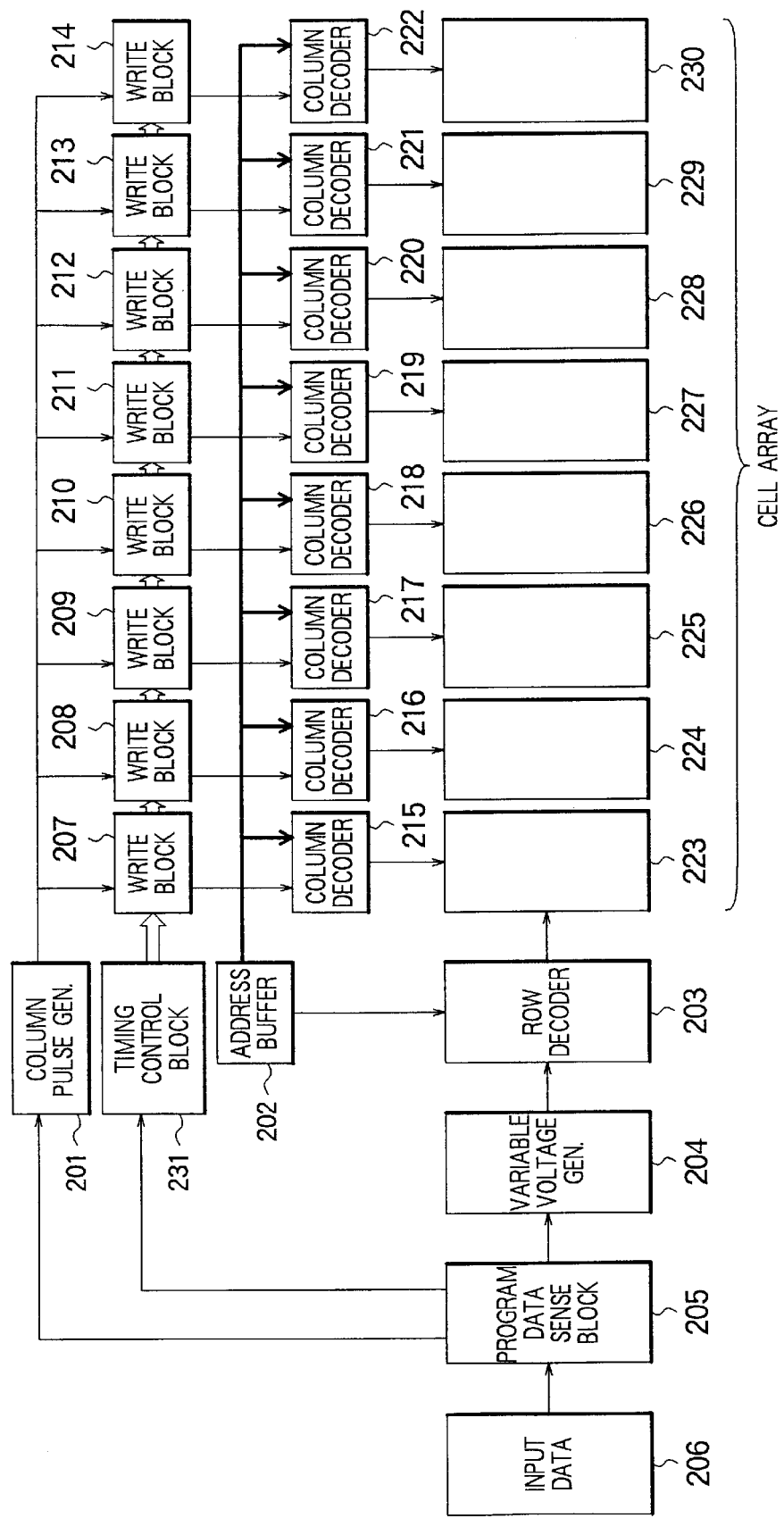
FIG. 12 is a block diagram of a flash EEPROM implementing the programming process of FIGS. 9 and 10.

Referring to FIG. 12, there is shown a circuit configuration of a flash EEPROM for implementing the programming process according to the embodiment of FIGS. 9 and 10. The programming circuit shown in FIG. 12 is similar to that shown in FIG. 2 except for a timing control block 231 provided in the present embodiment for controlling the write blocks 207 to 214 to supply the select pulse to the bit lines during parallel programming of a page of the memory cells. The other configurations of FIG. 12 are similar to those of FIG. 2, and the description with reference to FIG. 2 in this text is incorporated herein by reference.

Figure 13:
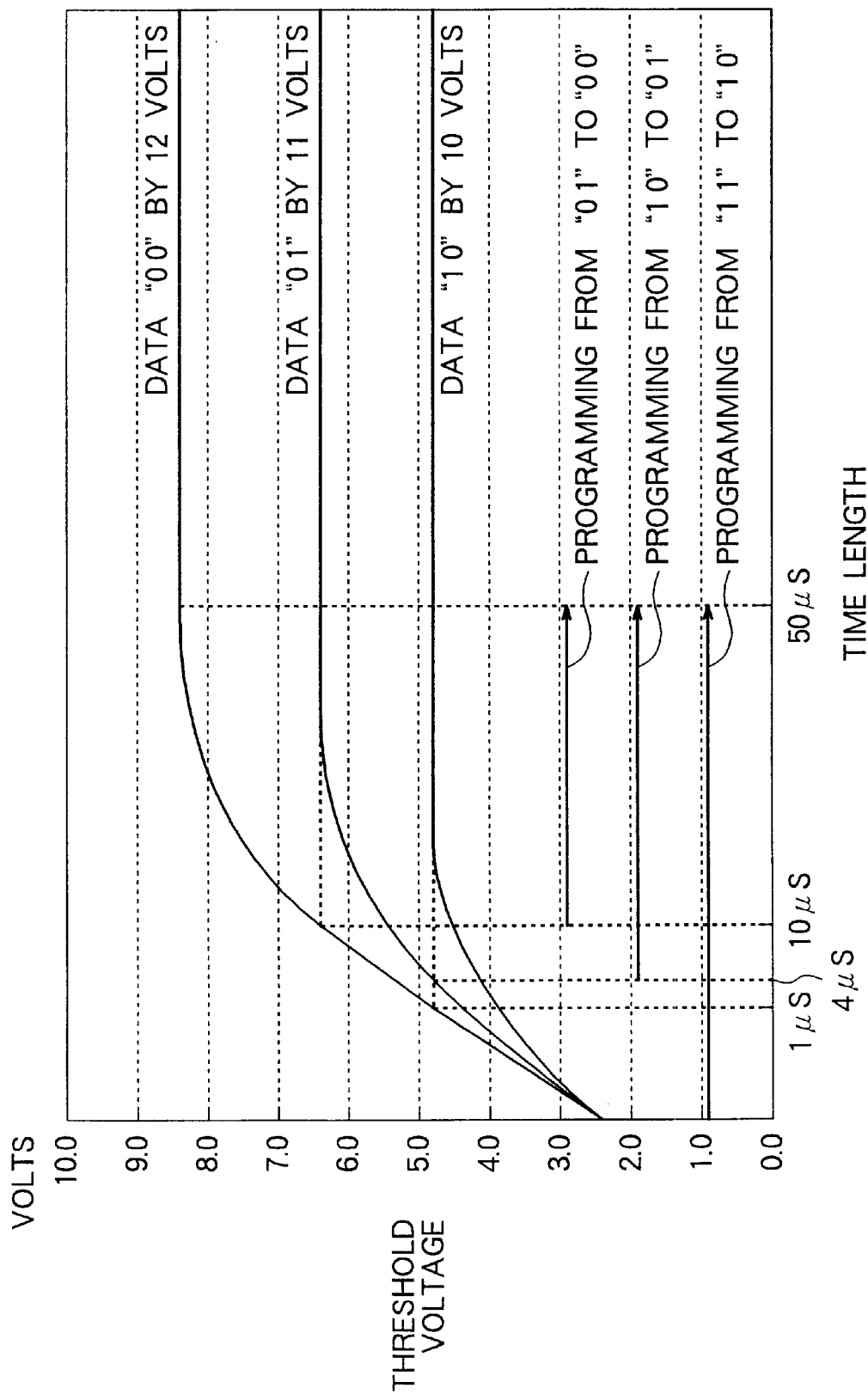
FIGS. 13 to 15 are graphs each for showing programming time length of a corresponding flow in the embodiment of FIGS. 9 and 10.

Referring to FIG. 13, there are shown programmed threshold voltages against programming time length, which were obtained during programming memory cells from data "11", or an erased state, to data "10", "01" and "00" by respective programming voltages. The results of FIG. 13 was obtained in the condition wherein the first programming voltage was about 10 volts with the drain voltage from the bit line at about 5 volts, the second programming voltage was about 11 volts with the drain voltage at about 5.5 volts, and the third programming voltage was about 12 volts with the drain voltage at about 6 volts. The illustrated curves indicate that each of the programming from data "11" to the respective data "10", "01" and "00" consumes about 50 $\mu$s. It is derived from the curves that the flows #1 to #3 of FIG. 9, wherein the values for parallel programming include only one value for a page, consumes 50 $\mu$s for programming, with additional 1 $\mu$s for the subsequent verifying, totaling 51 $\mu$s for each of the flows.

It is also derived from the curves that, in the case encountered in flow #7, the programming from data "11" to data "10" consumes about 50 $\mu$s in the first through third groups, programming from data "10" to data "01" consumes about 46 $\mu$s in the second and third groups, and programming from data "10" to data "00", consumes about 40 $\mu$s in the third group. Thus, flow #7 consumes 136 $\mu$s (50+46+40 $\mu$s) for programming of three different groups, with additional 3 $\mu$s for verifying, totaling 139 $\mu$s for the case.

Figure 14:
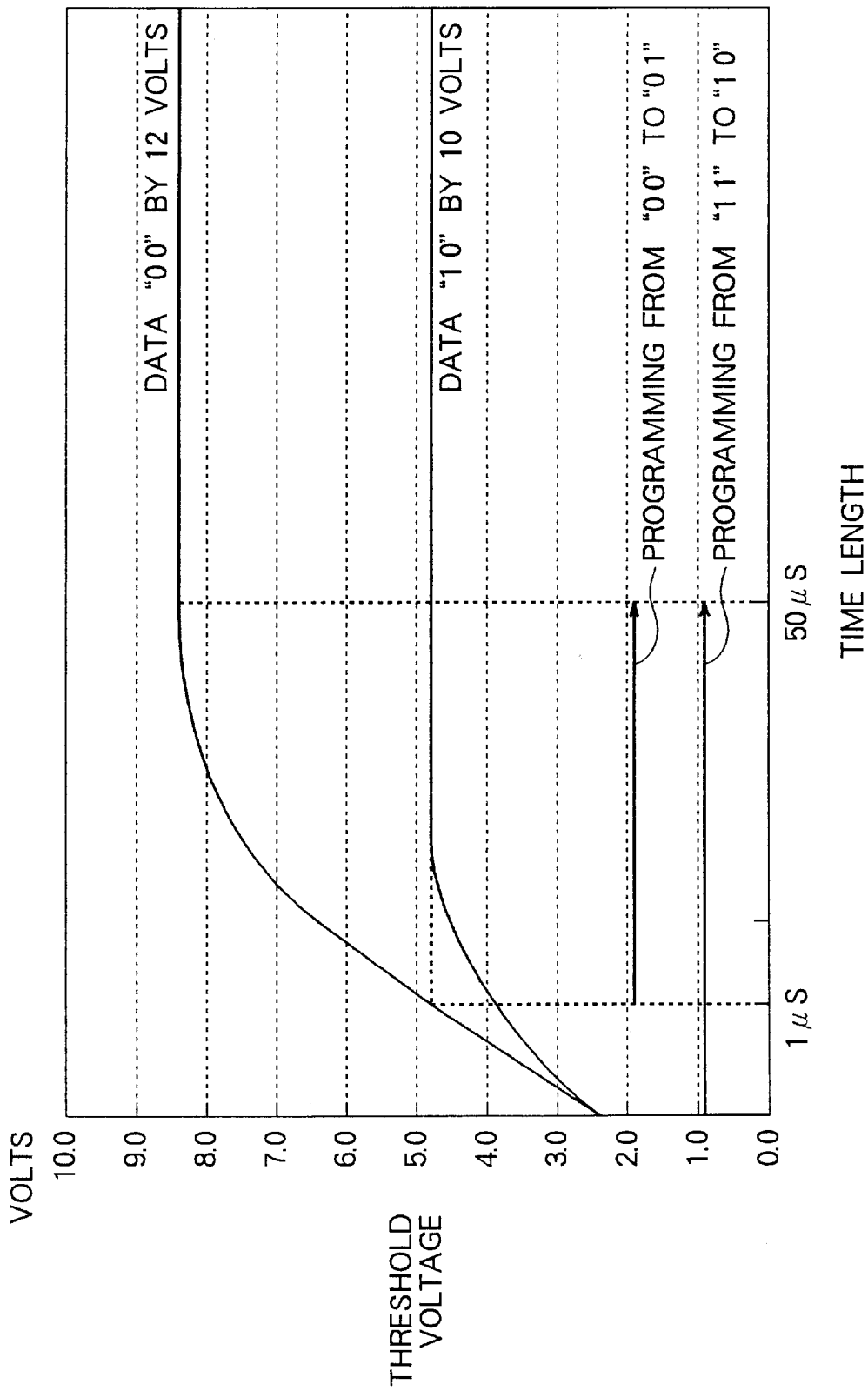

Referring to FIG. 14, there are shown curves for programming from data "11" to data "00" and "10", similarly to FIG. 13. It is derived from the curves that programming from data "11" to data "10" consumes about 50 $\mu$s and programming from data "10" to data "00" consumes 49 $\mu$s, in the case encountered in flow #5. Thus, flow #5 consumes 99 $\mu$s (50+49 $\mu$s) for programming, with additional 2 $\mu$s for verifying, totaling 101 $\mu$s for the case.

Figure 15:
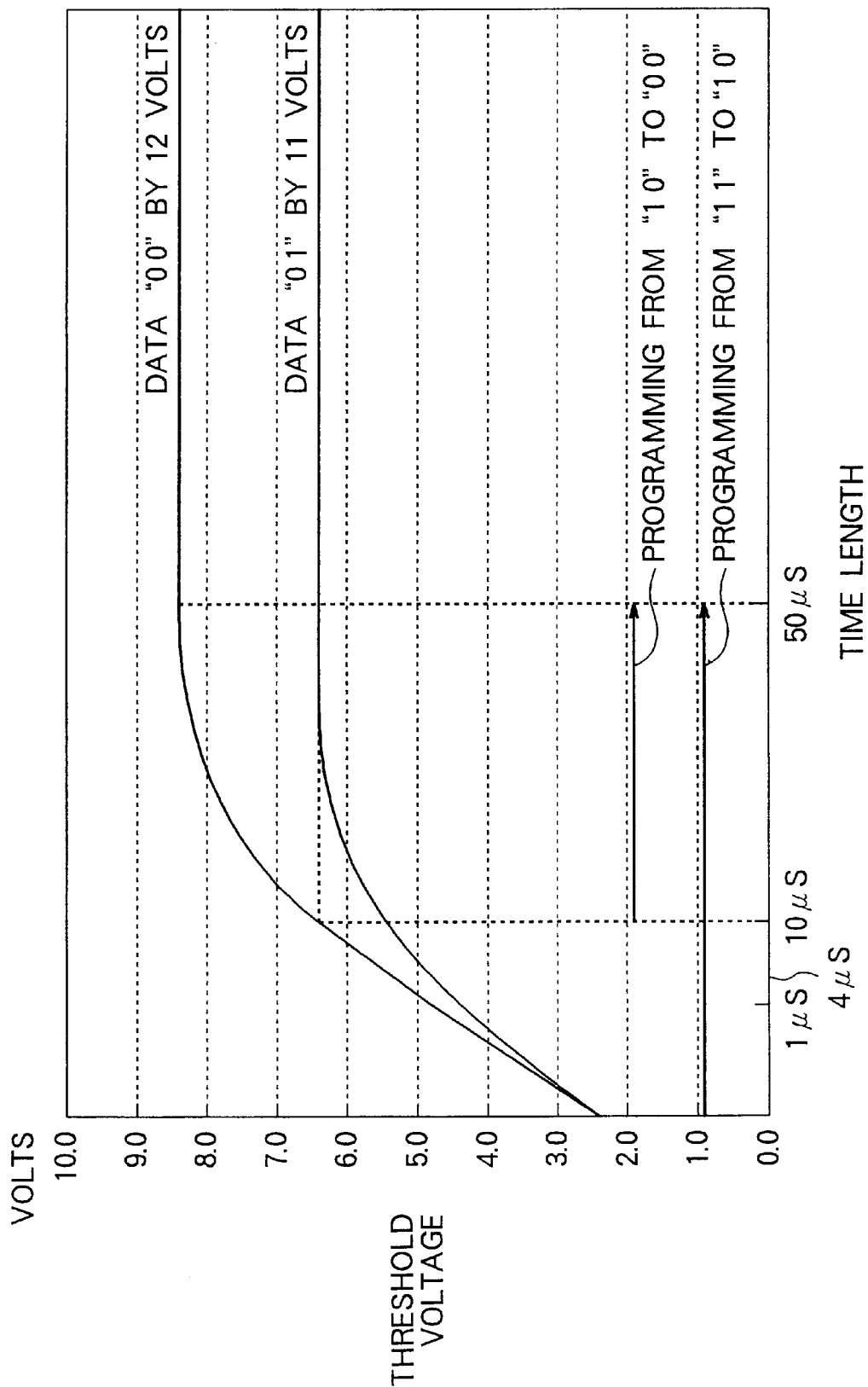

Referring to FIG. 15, there are shown curves for programming from data "11" to data "00" and "01", similarly to FIG. 13. It is derived from the curves that programming from data "11" to data "01" consumes about 50 $\mu$s and programming from data "01" to data "00" consumes 40 $\mu$s, in the case encountered in flow #6. Thus, flow #6 consumes 90 $\mu$s (50+40 $\mu$s) for programming, with additional 2 $\mu$s for verifying, totaling 92 $\mu$s for the case.

Figure 3:
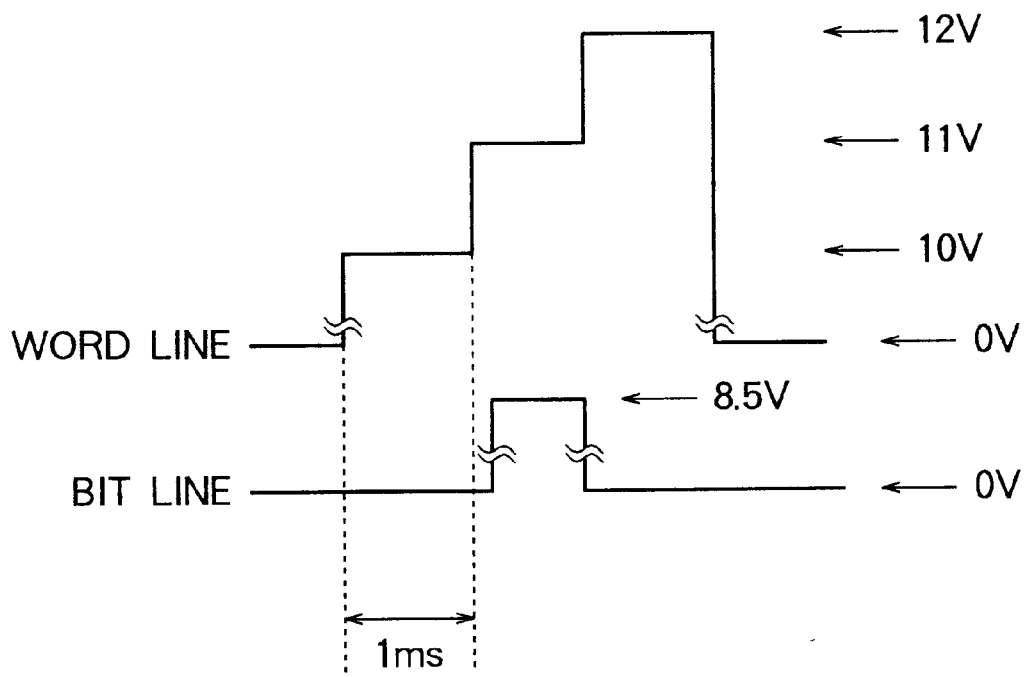
FIG. 3 is a diagram of a stepwise-rising programming voltage for use in programming of a multi-valued memory cell, described in a publication.

FIG. 16 tabulates the programming time length for each flow in the present embodiment and first and second conventional techniques. In this table, the first conventional technique, such as described in JP-A-6-267285, applies a stepwise-rising programming voltage including 10, 11 and 12 volts for 50 $\mu$s each, as shown in FIG. 3, irrespective of the values for a parallel programming. For example, the technique consumes 3×50 $\mu$s+(3 $\mu$s or 2 $\mu$s or 1 $\mu$s), wherein 3 $\mu$s, 2 $\mu$s or 1 $\mu$s is a verifying time length. The second technique, wherein a number of combinations of a short time programming and verifying with a high programming voltage, as mentioned before, consumes a time length of (200 ns+1 $\mu$s)×250 for programming to data "00", 60 $\mu$s for programming to data "01", and 6 $\mu$s for programming to data "10".

As understood from FIG. 16, the embodiment of the present invention achieves a higher programming rate in most of the cases tabulated, compared to the conventional techniques. Although the second conventional technique achieves a higher rate in the case of data "10" at the bottom of the table, this case is rare in the practical programming data for the flash EEPROM.

In the above embodiment, description is given for an example of four data values of parallel programming. However, the present invention can be applicable to any number of data values stored in multi-valued memory cells.

Since the above embodiments are described only for examples, the present invention is not limited to the above embodiments and various modifications or alterations can be easily made therefrom by those skilled in the art without departing from the scope of the present invention.

What is claimed is:

1. A method for programming a nonvolatile memory device having a plurality of memory cells grouped in a plurality of blocks, for storing multi-valued data represented as multi-valued threshold voltages, said method comprising the step of detecting a plurality of program data to be programmed in said memory cells in one of said blocks, and further, upon detecting a first value to be programmed in a first group of said memory cells in said one of blocks and a second value to be programmed in a second group of said memory cells in said one of blocks, the steps of consecutively applying a first programming voltage, which corresponds to said first value, to said first group and said second group maintained at a first potential, and applying a second programming voltage, which corresponds to said second value, to said second group.

2. A method as defined in claim 1, wherein said second programming voltage with respect to said first potential is larger than said first programming voltage with respect to said first potential.

3. A method as defined in claim 1 wherein, upon detecting a third value to be programmed in a third group of said memory cells in said one of blocks in addition to said first and second groups, first and second programming voltage applying steps apply said first programming voltage and said second programming voltage to said third group, and said method comprises the step of applying a third programming voltage, which corresponds to said third value, to said third group.

4. A method as defined in claim 3, wherein said third programming voltage with respect to said first potential is larger than said second programming voltage with respect to said first potential.

5. A method as defined in claim 1, wherein said first and second programming voltages are applied to control gates of said first and second groups of memory cells through a corresponding word line, and select pulses are applied to drains of said first and second groups of memory cells through corresponding bit lines at timings of said first and second programming voltages.

* * * * *